United States Patent
Yeh et al.

(10) Patent No.: US 11,815,970 B2
(45) Date of Patent: Nov. 14, 2023

(54) ENABLING SYSTEM BOOT-UP IN LOW TEMPERATURE ENVIRONMENTS

(71) Applicant: Dell Products L.P., Round Rock, TX (US)

(72) Inventors: Yi-Hao Yeh, New Taipei (TW); Gary Charles, Round Rock, TX (US); John Robert Lerma, Cedar Park, TX (US); Cheng-Hung Yang, Taipei (TW); Wei-Che Chang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 111 days.

(21) Appl. No.: 17/702,541

(22) Filed: Mar. 23, 2022

(65) Prior Publication Data

US 2023/0305611 A1 Sep. 28, 2023

(51) Int. Cl.
| | | |
|---|---|---|
| G06F 1/26 | (2006.01) | |
| G01R 31/00 | (2006.01) | |
| G01R 31/382 | (2019.01) | |
| G01R 31/371 | (2019.01) | |
| G06F 1/3212 | (2019.01) | |

(52) U.S. Cl.
CPC ........... *G06F 1/263* (2013.01); *G01R 31/371* (2019.01); *G01R 31/382* (2019.01); *G06F 1/3212* (2013.01)

(58) Field of Classification Search
CPC ...... G06F 1/263; G01R 31/382; G01R 31/371
See application file for complete search history.

(56) References Cited

U.S. PATENT DOCUMENTS

| | | | | |
|---|---|---|---|---|
| 5,610,495 A | * | 3/1997 | Yee | H01M 10/48 320/DIG. 13 |
| 6,992,403 B1 | * | 1/2006 | Raad | F02C 7/275 290/10 |
| 7,003,679 B1 | * | 2/2006 | Lesea | H03K 19/17732 713/300 |
| 2006/0132086 A1 | * | 6/2006 | Altenburg | H02J 9/061 320/106 |
| 2014/0361730 A1 | * | 12/2014 | Kung | H02M 3/1584 320/107 |

FOREIGN PATENT DOCUMENTS

| | | | | |
|---|---|---|---|---|
| EP | 1801948 A1 | * | 6/2007 | ............... H02J 1/10 |
| EP | 3806274 A2 | * | 4/2021 | ............... H02J 50/80 |

\* cited by examiner

*Primary Examiner* — Mark A Connolly
(74) *Attorney, Agent, or Firm* — KIRTON MCCONKIE; Brian Tucker

(57) ABSTRACT

System boot-up can be enabled in low temperature environments. A laptop or other battery-powered computing device can include multiple batteries and a battery architecture that allows the multiple batteries to simultaneously discharge to thereby provide adequate power to boot the system in low temperature environments. The battery architecture may also allow a battery with a higher relative state of charge to charge another battery with a lower relative state of charge to thereby equalize the batteries' relative states of charge.

19 Claims, 14 Drawing Sheets

ENABLING SYSTEM BOOT-UP IN LOW TEMPERATURE ENVIRONMENTS

CROSS-REFERENCE TO RELATED APPLICATIONS

N/A

BACKGROUND

Laptops and other battery-powered computing devices typically use lithium-ion batteries. The chemical reactions that occur within lithium-ion batteries to provide electric current are slowed in low temperature environments. For example, at −20° C., a lithium-ion battery may only be capable of operating at a discharge rate of 0.2 C. In many cases, a 0.2 C discharge rate is insufficient to boot the operating system. For example, a laptop with a 53.5 WHr battery operating at 0.2 C will only have 10.7 W (0.2 C*53.5) available to boot the system. Yet, the laptop may require between 20 W and 30 W to successfully boot. In such cases, the laptop would fail to boot due to the battery's inability to supply adequate power.

FIG. 1 is a simplified block diagram of a prior art battery architecture 100 for a laptop or other battery-powered computing device. Battery architecture 100 includes a primary battery 101a and a secondary battery 101b that are connected to a battery control circuit 102. Among other things, battery control circuit 102 can include a switch 102a and a switch 102b (e.g., implemented using field effect transistors) which control whether primary battery 101a or secondary battery 101b respectively provides the system power (e.g., the power to boot and run the operating system and other hardware and software components) at any given time. In other words, in battery architecture 100, at any given time, only one of switches 102a and 102b will be on/closed so that only one of primary battery 101a or secondary battery 101b is discharged. Battery architecture 100 also includes a charger 104 (e.g., a buck boost charger) that allows primary battery 101a and secondary battery 101b to be charged via one or more input voltage sources (e.g., an AC/DC converter). A switch 103 may couple battery control circuit 102 to charger 104 and to the system power input(s) to control whether primary battery 101a or secondary battery 101b is charged or discharged. The arrows in this figure represent the provision of power. Although not shown, battery control circuit 102, switch 103, and charger 104 (along with possibly other components such as voltage regulators) can each include control inputs/outputs by which these components can intercommunicate to control the provision of system power and the charging of the batteries.

BRIEF SUMMARY

The present invention extends to systems, methods and computer program products for enabling system boot-up in low temperature environments. A laptop or other battery-powered computing device can include multiple batteries and a battery architecture that allows the multiple batteries to simultaneously discharge to thereby provide adequate power to boot the system in low temperature environments. The battery architecture may also allow a battery with a higher relative state of charge to charge another battery with a lower relative state of charge to thereby equalize the batteries' relative states of charge.

In some embodiments, the present invention may be implemented as a battery architecture that include a first battery control circuit by which a first battery and a second battery are selectively coupled to an output of a charger and system power, a second battery control circuit by which the first battery and the second battery are selectively coupled to an input of the charger, and an embedded controller that is coupled to the first battery control circuit and the second battery control circuit.

In some embodiments, the present invention may be implemented as a method for enabling system boot-up in low temperature environments. It can be detected in a battery architecture that a battery temperature is below a threshold. In response to detecting that the battery temperature is below the threshold, the battery architecture can be configured to simultaneously use a first battery and a second battery to provide power for booting a system.

In some embodiments, the present invention may be implemented as computing device that includes a battery architecture. The battery architecture can include a first battery control circuit by which a first battery and a second battery are selectively coupled to an output of a charger and system power, a second battery control circuit by which the first battery and the second battery are selectively coupled to an input of the charger, and an embedded controller that configures the first battery control circuit and the second battery control circuit to implement a first mode of operation and a second mode of operation. In the first mode of operation, one of the first battery or the second battery charges the other of the first battery or the second battery. In the second mode of operation, the first battery and the second battery simultaneously provide power to the system.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

In the specification and the claims, the term "low temperature environment" represents scenarios where the temperature of a battery is below a threshold at which its discharge rate may be too low to adequately power a computing device. As an example, at −20° C., a standard lithium-ion battery will typically have a maximum discharge rate of 0.2 C which may be insufficient to boot the operating system on a laptop. Although embodiments of the present invention are primarily described in the context of a laptop, the described techniques can be implemented in a battery architecture of any computing device including tablets, smart phones, desktops, etc.

Figure 2:
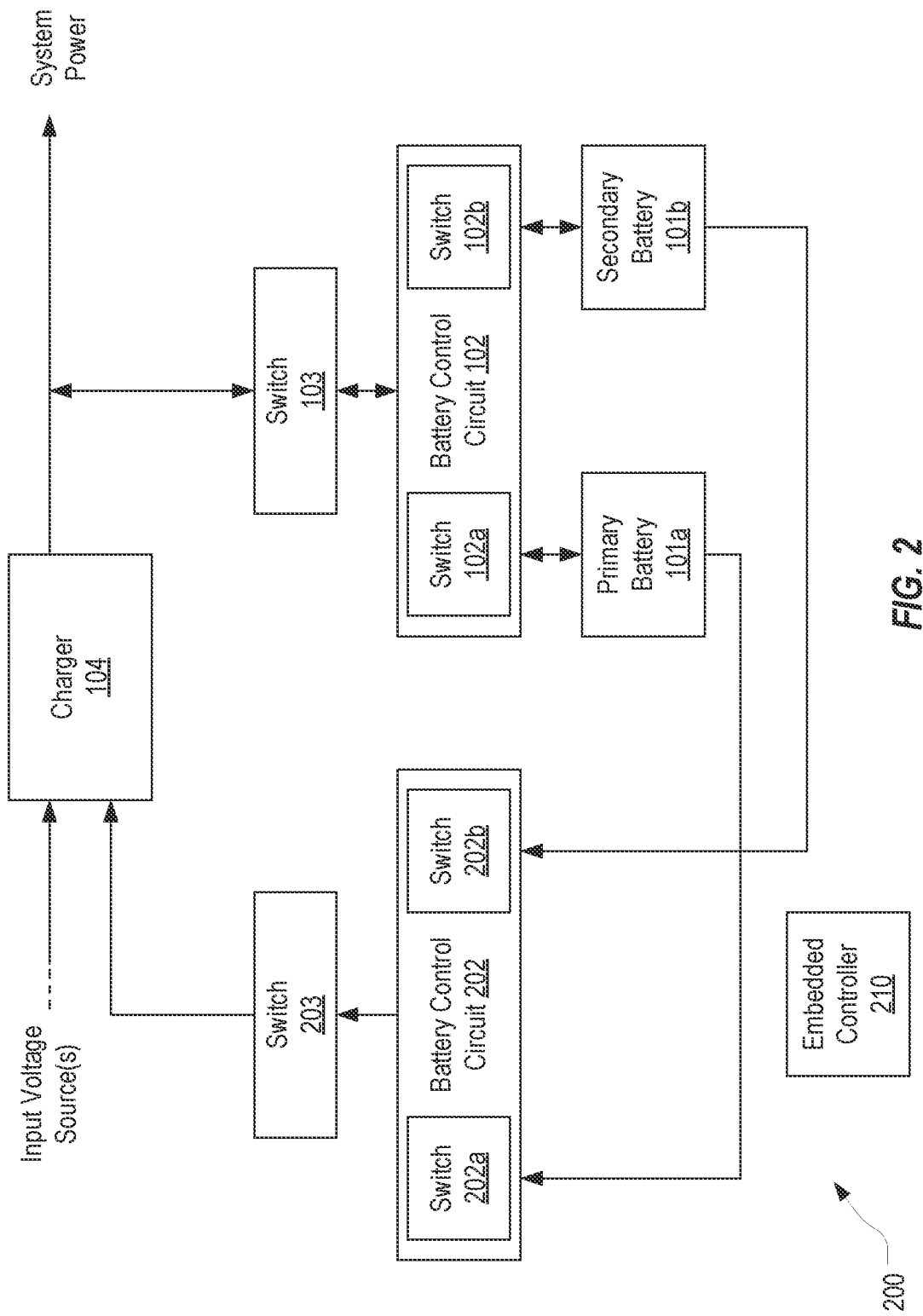
FIG. 2 provides an example of a battery architecture that is configured in accordance with one or more embodiments of the present invention.

FIG. 2 provides an example of a battery architecture 200 that is configured in accordance with one or more embodiments of the present invention. In typical cases, battery architecture 200 may be used in a rugged laptop or other battery-powered computing device that is intended to be used in low temperature environments. However, battery architecture 200 could be used in any computing device in which the techniques of the present invention may be desired.

Battery architecture 200 is based on battery architecture 100 and therefore includes primary battery 101a, secondary battery 101b, battery control circuit 102, switch 103 and charger 104. Additionally, battery architecture 200 includes an embedded controller 210, a battery control circuit 202 which may include a switch 202a and a switch 202b corresponding to primary battery 101a and secondary battery 101b respectively, and a switch 203 by which battery control circuit 202 is connected to an input of charger 104. Notably, if a battery architecture includes more than two batteries, battery control circuit 102 and battery control circuit 202 can include an additional switch for each additional battery. Accordingly, embodiments of the present invention should not be limited to battery architectures that include two batteries.

Figure 1:
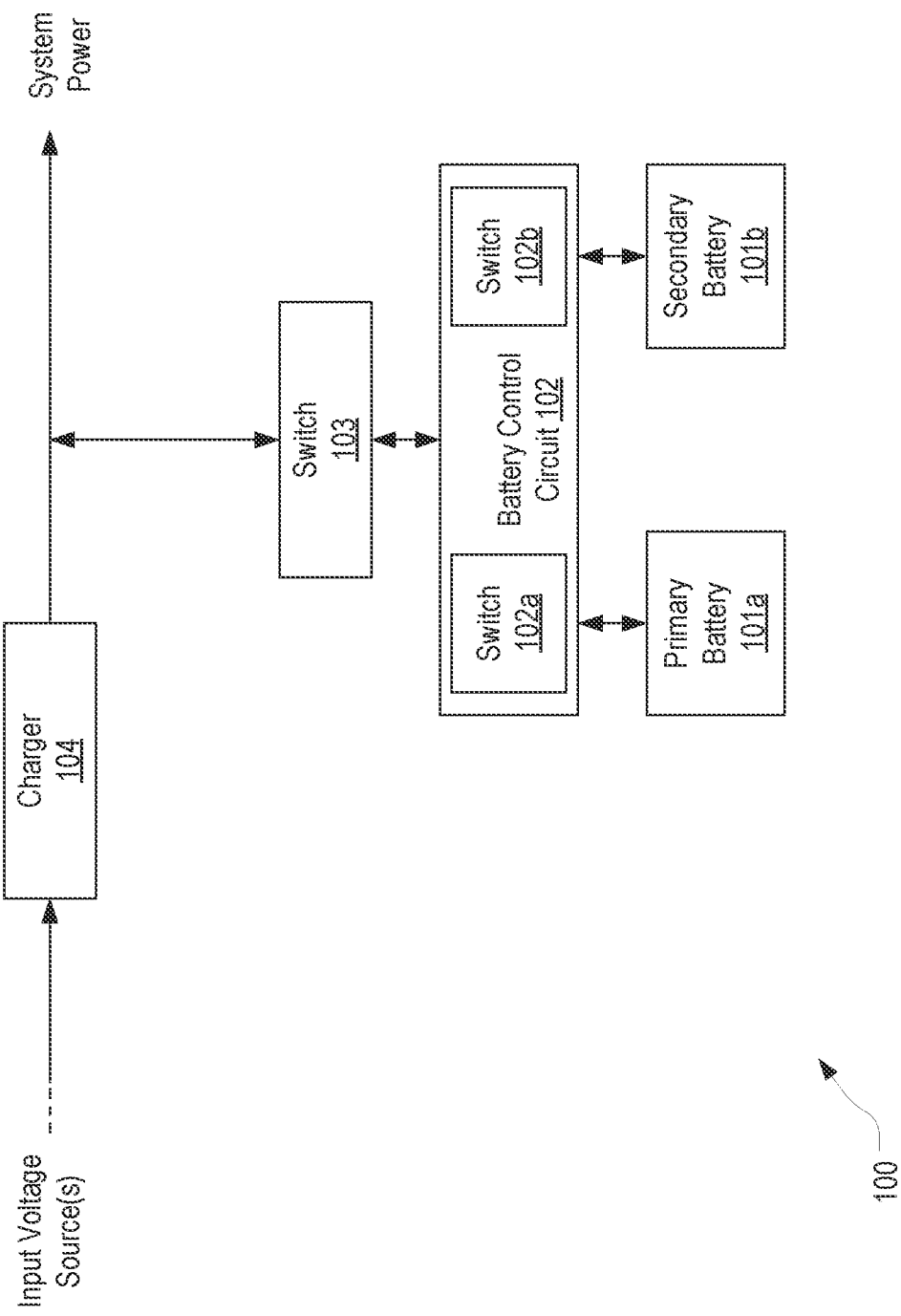
FIG. 1 provides an example of a prior art battery architecture for a laptop or other battery-powered computing device.

The arrows in FIG. 2 represent possible flow of current in battery architecture 200. In addition to what is shown in FIG. 1, in FIG. 2, primary battery 101a and secondary battery 101b can be connected to battery control circuit 202 which can use switch 202a and switch 202b to selectively connect either primary battery 101a or secondary battery 101b to charger 104 via switch 203. In this way, either primary battery 101a or secondary battery 101b can function as an input power source (e.g., as if the laptop were plugged in to a power source).

Figure 3A:
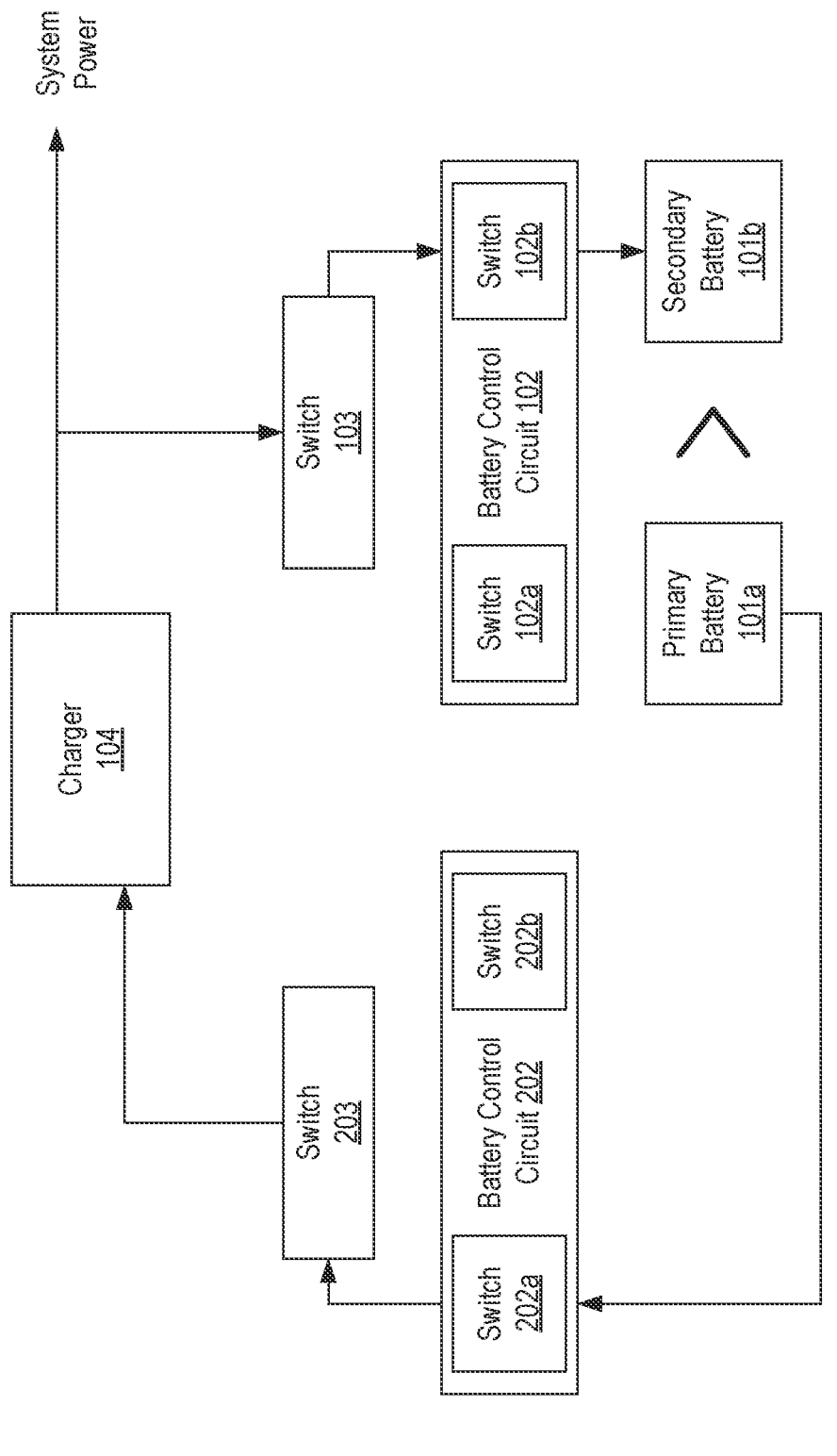
FIGS. 3A and 3B illustrate how the battery architecture of FIG. 2 can be configured to use one battery as an input power source for charging the other battery.
Figure 3B:
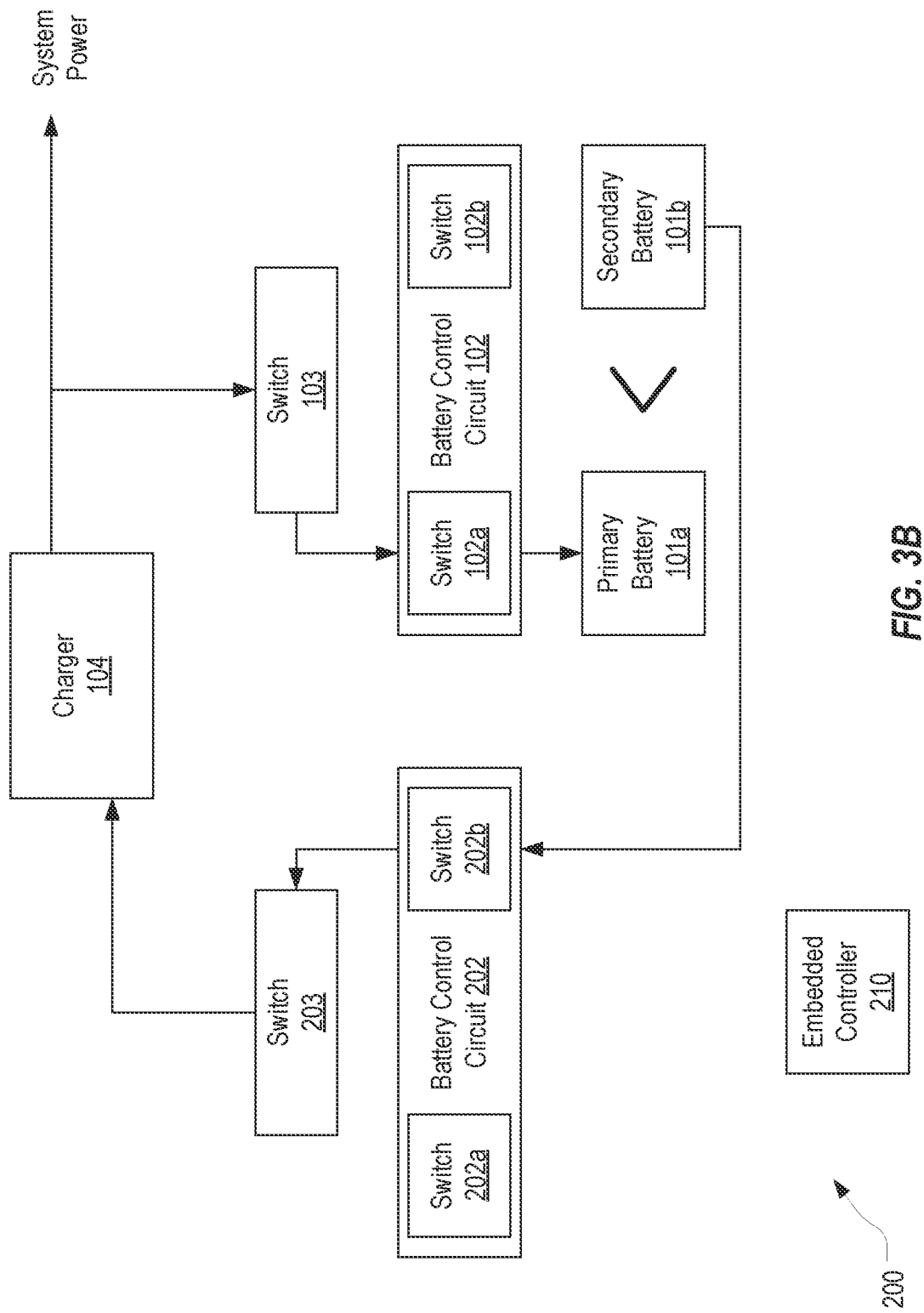

Embedded controller 210 can be connected to battery control circuit 102, switch 103, battery control circuit 202, and switch 203 to control these components as part of implementing two modes of operation in low temperature environments. In a first mode of operation, embedded controller 210 can configure battery architecture 200 to use one of primary battery 101a or secondary battery 101b to charge the other of primary battery 101a or secondary battery 101b. This first mode of operation may be utilized in low temperature environments or at any time when it is desired to equalize the RSOC of each battery as described below. FIGS. 3A and 3B provide examples of this first mode of operation.

In FIG. 3A, it is assumed that primary battery 101a has a higher charge than secondary battery 101b (e.g., a higher relative state of charge), which embedded controller 210 could detect in any suitable manner such as via a battery fuel gauge. In response, embedded controller 210 can activate switch 202a and switch 203 to connect primary battery 101a to charger 104 as an input power source. Embedded controller 210 can also activate switch 102b and switch 103 to connect an output of charger 104 to secondary battery 101b such that primary battery 101a charges secondary battery 101b. In this mode of operation, it is also possible that primary battery 101a could power the system via charger 104. However, in low temperature environments, primary battery 101a alone may have an insufficient discharge rate to power the system while also charging secondary battery 101b. Accordingly, the primary purpose of this mode of operation is to equalize the charges (e.g., the RSOC) of primary battery 101a and secondary battery 101b.

FIG. 3B is similar to FIG. 3A except that it is assumed that secondary battery 101b has a higher charge than primary battery 101a. Therefore, embedded controller 210 can activate switch 202b rather than switch 202a to thereby connect secondary battery 101b to charger 104 as an input power source. Embedded controller 210 can also activate switch 102a rather than switch 102b to thereby cause primary battery 101a to be charged by secondary battery 101b. As stated above, in this mode of operation, it is also possible that secondary battery 101b could power the system via charger 104.

Figure 3C:
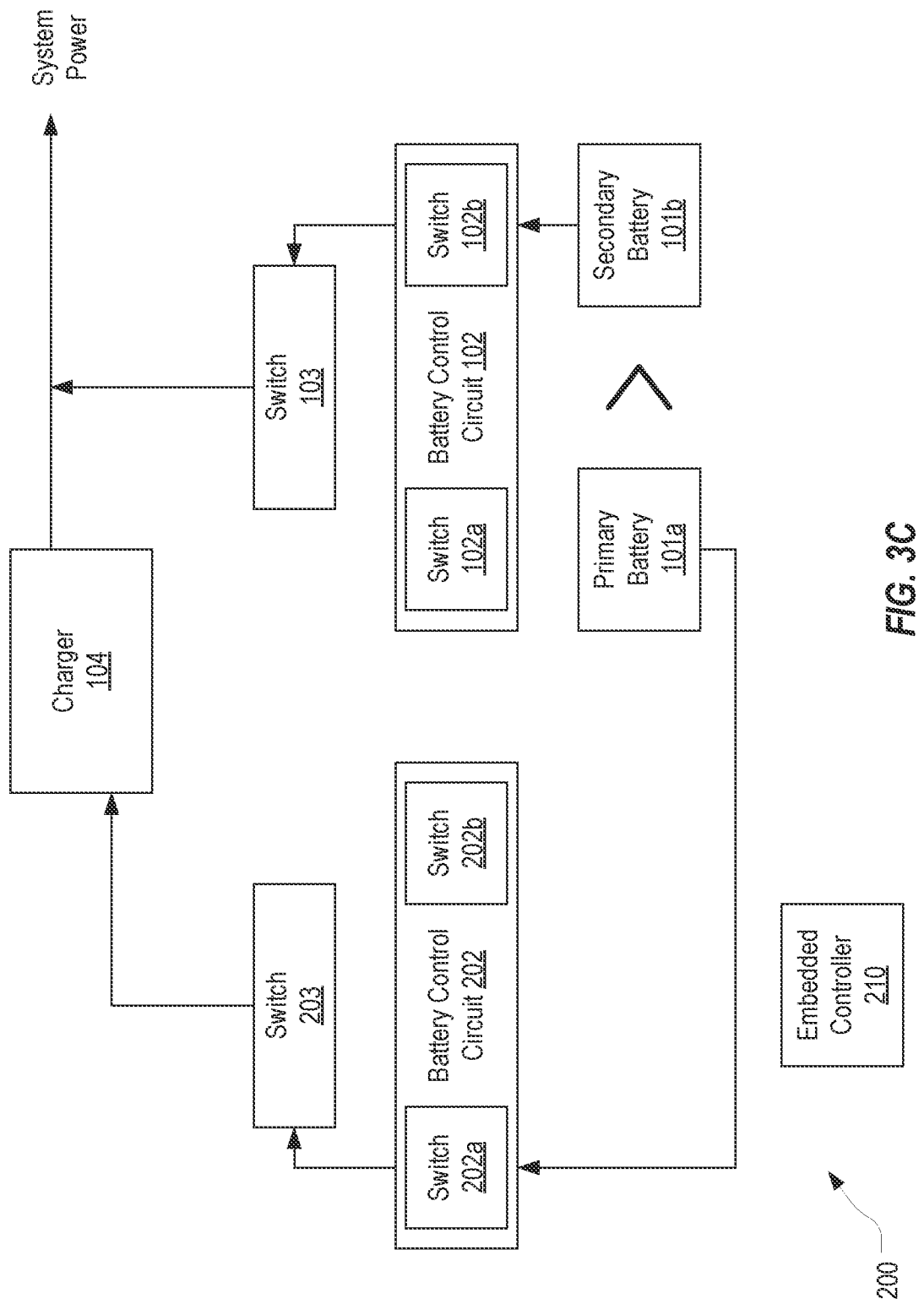
FIGS. 3C and 3D illustrate how the battery architecture of FIG. 2 can be used in a hybrid mode in which one battery provides power to the system via the charger and another battery provides power to the system directly.
Figure 3D:
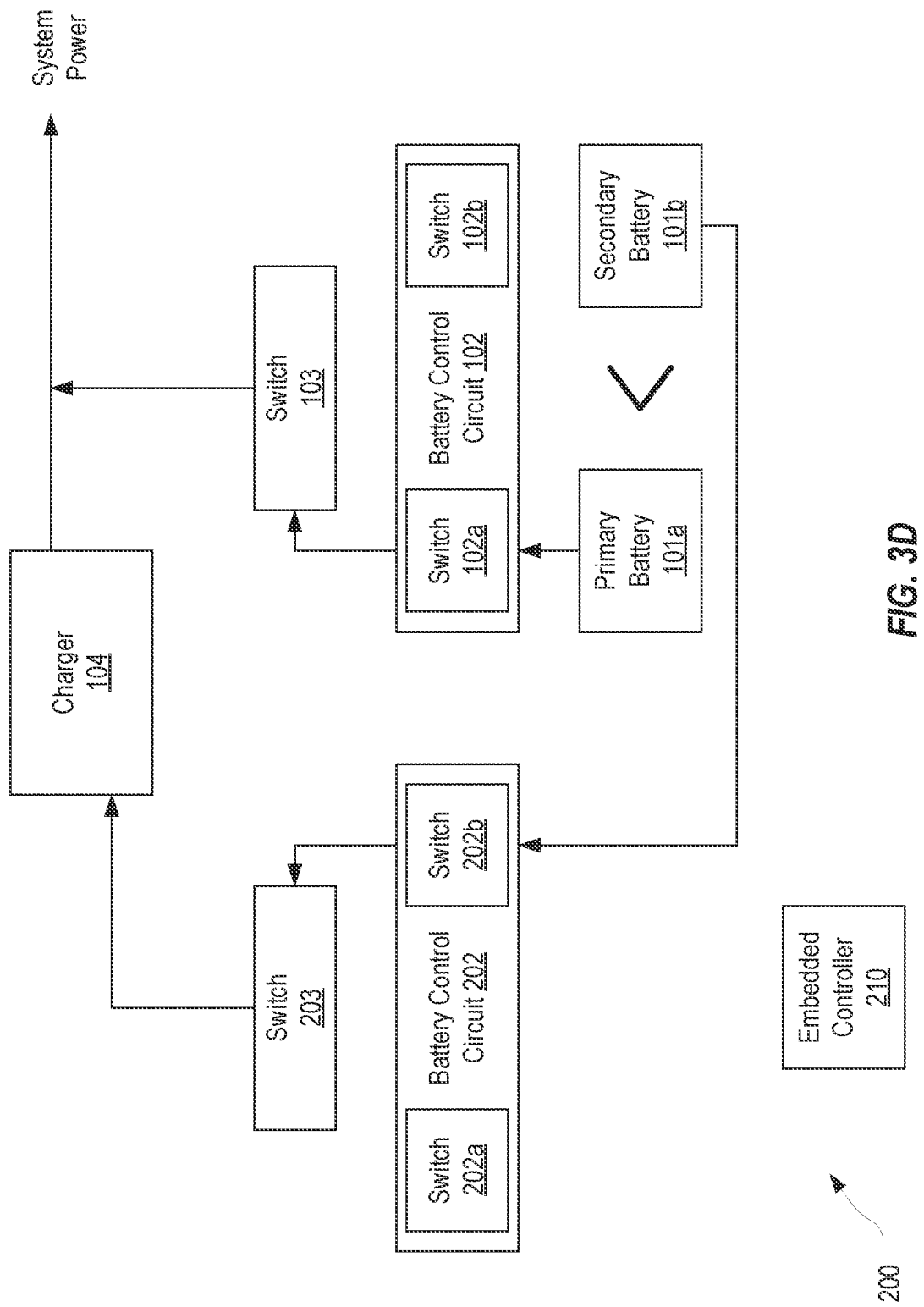

FIGS. 3C and 3D show a hybrid mode of operation which is a variation of the first mode of operation shown in FIGS. 3A and 3B respectively. In this hybrid mode, and similar to the first mode of operation, the battery with the higher charge can be connected to charger 104 to function as an input power source for powering the system while the battery with the lower charge can also provide power to the system. This hybrid mode could be used to attempt to boot the system in low temperature environments and/or to provide a turbo boost in any environment. As represented in FIGS. 3C and 3D, in hybrid mode, both primary battery 101a and secondary battery 101b would provide current for powering the system with one doing so via charger 104 and the other doing so directly.

Figure 4:
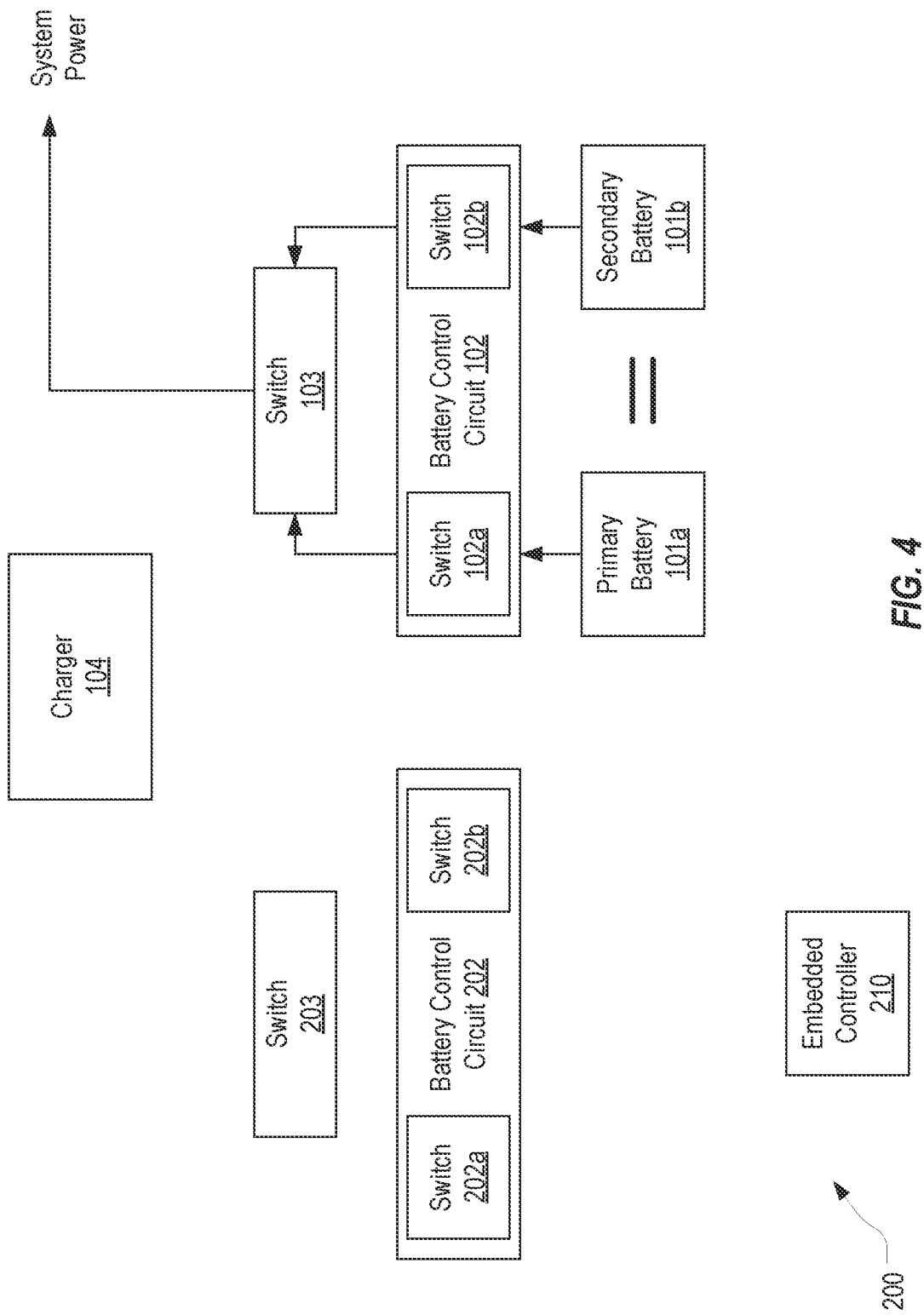
FIG. 4 illustrates how the battery architecture of FIG. 2 can be configured to use both batteries simultaneously to power the system.

In a second mode of operation, embedded controller 210 can configure battery architecture 200 to use both primary battery 101a and secondary battery 101b to power the system. FIG. 4 provides an example of this second mode of operation. In FIG. 4, it is assumed that primary battery 101a and secondary battery 101b have substantially the same charge (e.g., relative states of charge that are within some defined threshold such as 5% of one another) which embedded controller 210 could detect in any suitable manner such as via a battery fuel gauge. In some instances, primary battery 101a and secondary battery 101b could reach this same charge via the first mode of operation or hybrid mode. In other instances, primary battery 101a and secondary battery 101b could reach this same charge via typical charging (i.e., via an AC adapter) and/or via typical discharge (e.g., when one battery is discharged to power the system).

When embedded controller 210 detects that primary battery 101a and secondary battery 101b have substantially the same charge while also detecting that the batteries are in a low temperature environment (e.g., by detecting that one or both of the batteries have a temperature at least as cold as −20° C.), embedded controller 210 can activate switch 102a and switch 102b simultaneously and also activate switch 103 to thereby cause primary battery 101a and secondary battery 101b to simultaneously discharge to power the system.

By configuring battery architecture 200 to simultaneously use both primary battery 101a and secondary battery 101b to power the system, embedded controller 210 can ensure that battery architecture 200 can provide sufficient power to power the system in a low temperature environment when an external power source is not available (e.g., when a laptop is not plugged in). As an example, if each of primary battery 101a and secondary battery 101b can provide 53.5 W of power at 1 C but can only operate at 0.2 C in a low temperature environment, each battery alone may only be able to provide 10.7 W (0.2*53.5). Yet, the peak power of the system during boot may be 19.9 W. In such a case, the 10.7 W maximum power that one battery can provide in the low temperature environment would be insufficient to boot the system. However, by detecting the low temperature condition, embedded controller 210 can cause both primary battery 101a and secondary battery 101b to provide power for the system yielding a sum of 21.4 W (0.4*53.5) which exceeds the 19.9 W necessary to boot the system. The second mode of operation is not limited to low temperature environments but may be used at any time such as to provide for turbo boost to gain more performance.

Figure 5:
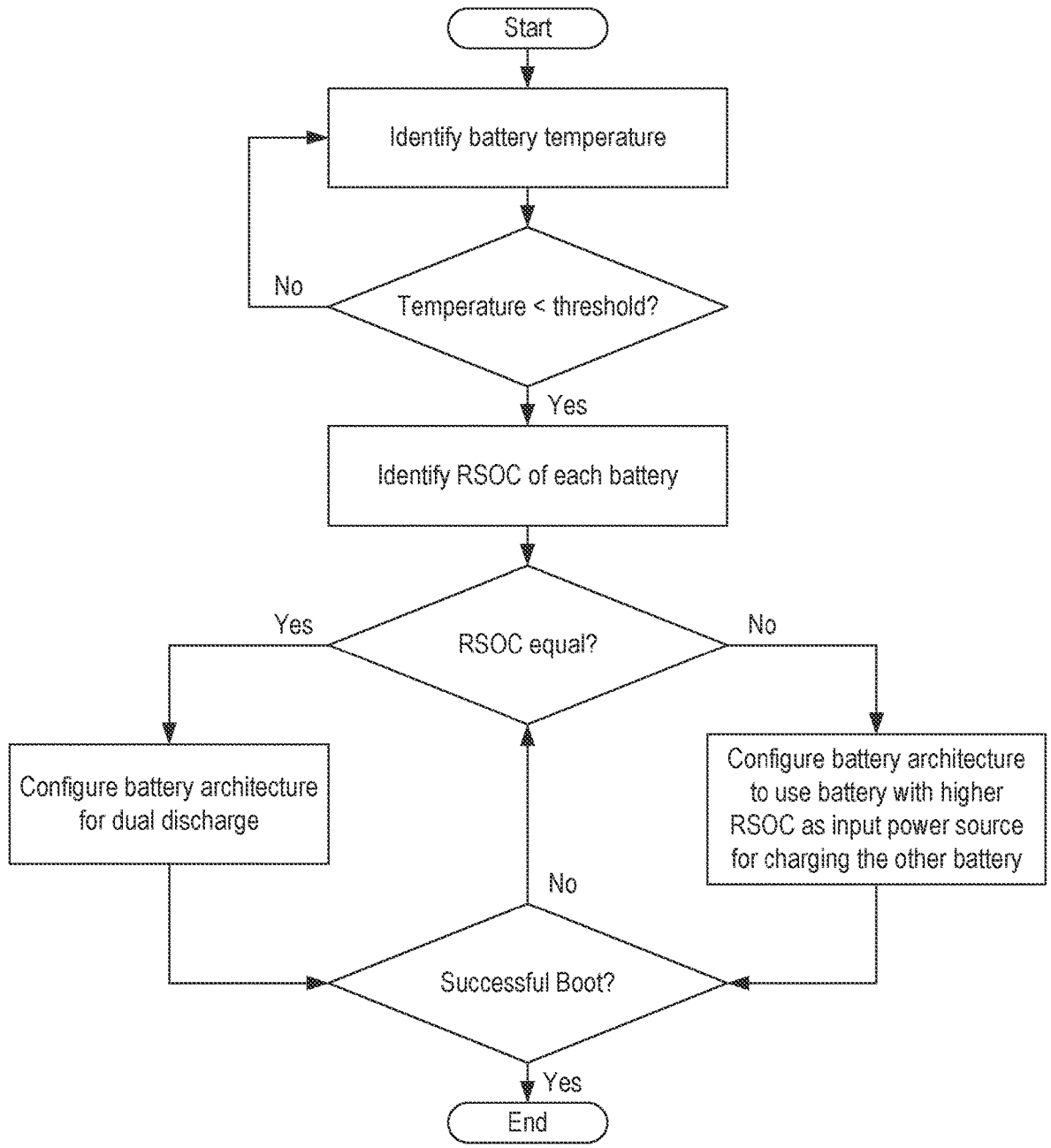
FIG. 5 is a flow chart of a method for enabling system boot-up in low temperature environments in accordance with one or more embodiments of the present invention.

FIG. 5 is a flow diagram of an example process that embedded controller 210 may perform in one or more embodiments of the present invention. Embedded controller 210 can be separately powered so that it may perform this process even when the system is not powered on. Initially, embedded controller 210 can identify the battery temperature. For example, embedded controller 210 may be configured to collect temperature data from a fuel gauge of primary battery 101a and/or secondary battery 101b. In some embodiments, embedded controller 210 can identify the battery temperature on a periodic basis such as every second including when the system is not powered on. Upon identifying the battery temperature, embedded controller 210 can determine whether the battery temperature is below a low temperature threshold. For example, embedded controller 210 could employ a defined low temperature threshold at which primary battery 101a and secondary battery 101b are known to have a discharge rate that is insufficient to power the system (e.g., −20° C.).

If the battery temperature is not below the low temperature threshold, embedded controller 210 can return to periodically checking the battery temperature and may allow battery architecture 200 to function in a typical manner (e.g., by configuring battery architecture 200 to provide power from only one of primary battery 101a or secondary battery 101b). In contrast, if the battery temperature is below the low temperature threshold, embedded controller 210 may identify the RSOC (or other indicator of charge) of each of primary battery 101a and secondary battery 101b. For example, embedded controller 210 could collect the RSOC from a fuel gauge of each of primary battery 101a and secondary battery 101b.

If the RSOC (or other indicator of charge) of primary battery 101a and secondary battery 101b do not match (e.g., are not within a defined threshold from one another), embedded controller 210 can configure battery architecture 200 to implement the first mode of operation in which the battery with the higher RSOC is used as an input power source to charge the other battery (or possibly in hybrid mode to power the system). In some embodiment, while one battery is used as an input power source for charging the other battery, embedded controller 210 can monitor to determine whether the system is successfully booted (e.g., if a user attempts to power on the system and the battery functioning as the input power source provides sufficient power to complete the boot process). If a boot is not successful (including if a boot is not attempted) and while the RSOC of each battery remains unequal, embedded controller 210 can retain the configuration of battery architecture 200 to continue using the battery with the higher RSOC to charge the battery with the lower RSOC.

If embedded controller 210 determines that the RSOC of primary battery 101a and secondary battery 101b are equal, whether initially or after the first mode of operation is employed, it can configure battery architecture 200 for dual discharge of primary battery 101a and secondary battery 101b (e.g., to implement the second mode of operation shown in FIG. 4). While both primary battery 101a and secondary battery 101b are simultaneously used to provide the system power, embedded controller 210 may continue to monitor for a successful boot. If the system is successfully booted, the process may end. If the system fails to boot successfully, embedded controller 210 may repeat the process (e.g., by possibly repeating the implementation of the first mode of operation to equalize the charges of the batteries and then implementing the second mode of operation to again attempt to successfully boot the system).

Figure 6A:
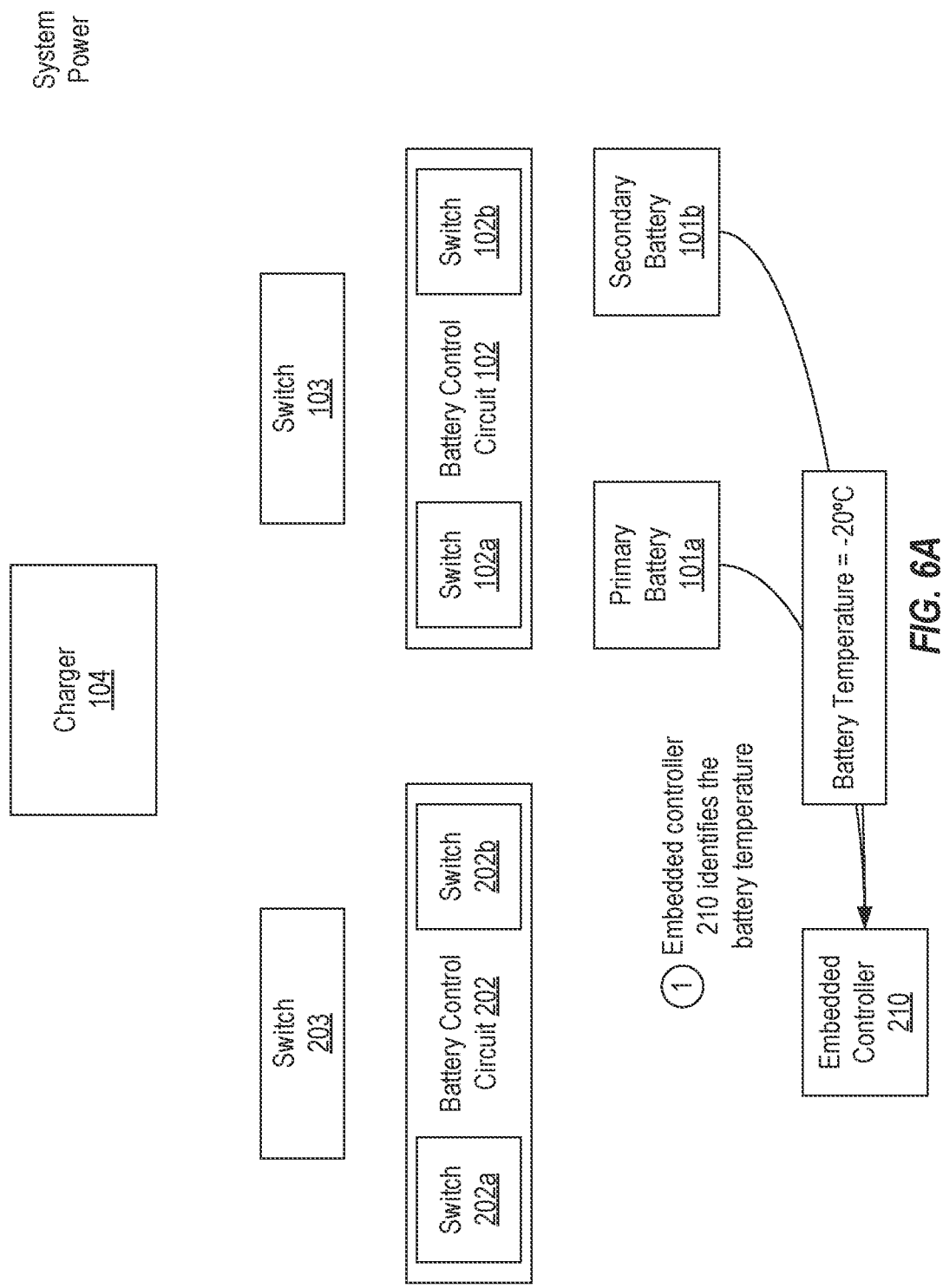
FIGS. 6A-6F provide an example of how an embedded controller of the battery architecture of FIG. 2 can configure the battery architecture to operate in different modes to enable system boot-up in low temperature environments.

FIGS. 6A-6F provide an example of how embedded controller 210 may configure battery architecture 200 to implement the first and second modes of operation in one or more embodiments of the present invention. In FIG. 6A, it is assumed that the system is not powered on and that an external input power source is not present (e.g., the laptop is not plugged in). As an example, a rugged laptop could be at a job site in the winter when the temperature is below −20° C. In step 1, embedded controller 210 can identify the battery temperature of one or both of primary battery 101a and secondary battery 101b such as by reading a fuel gauge. As shown, it is assumed that the battery temperature is −20° C.

Figure 6B:
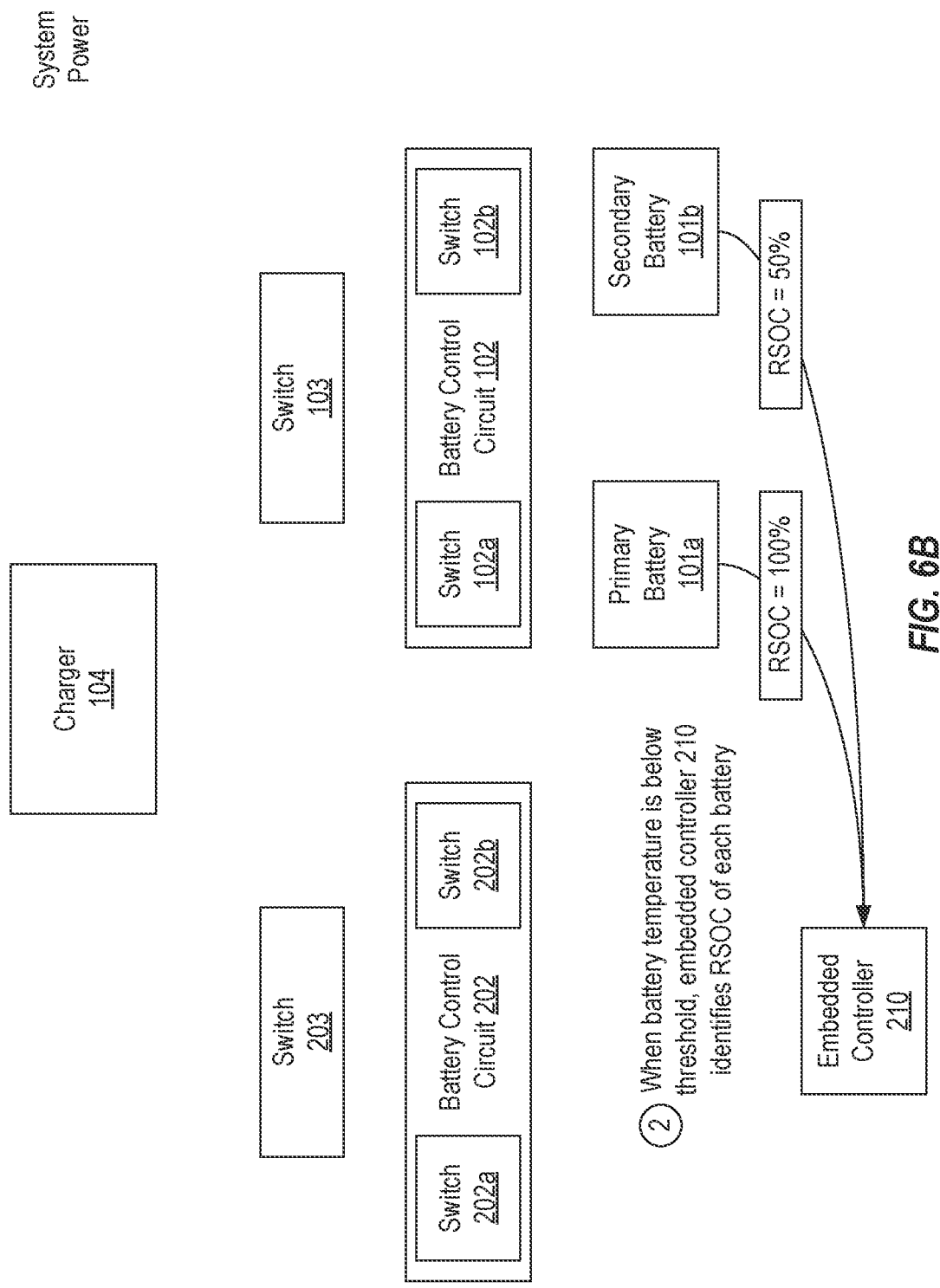

Turning to FIG. 6B, in step 2 and in conjunction with determining that the battery temperature is −20° C., embedded controller 210 can identify the RSOC of each of primary battery 101a and secondary battery 101b such as by reading a fuel gauge. In this example, it is assumed that the RSOC of primary battery 101a is 100% and the RSOC of secondary battery 101b is 50%. In some embodiments, embedded controller 210 could perform steps 1 and 2 at the same time such as by obtaining the battery temperature and the RSOC from a fuel gauge.

Figure 6C:
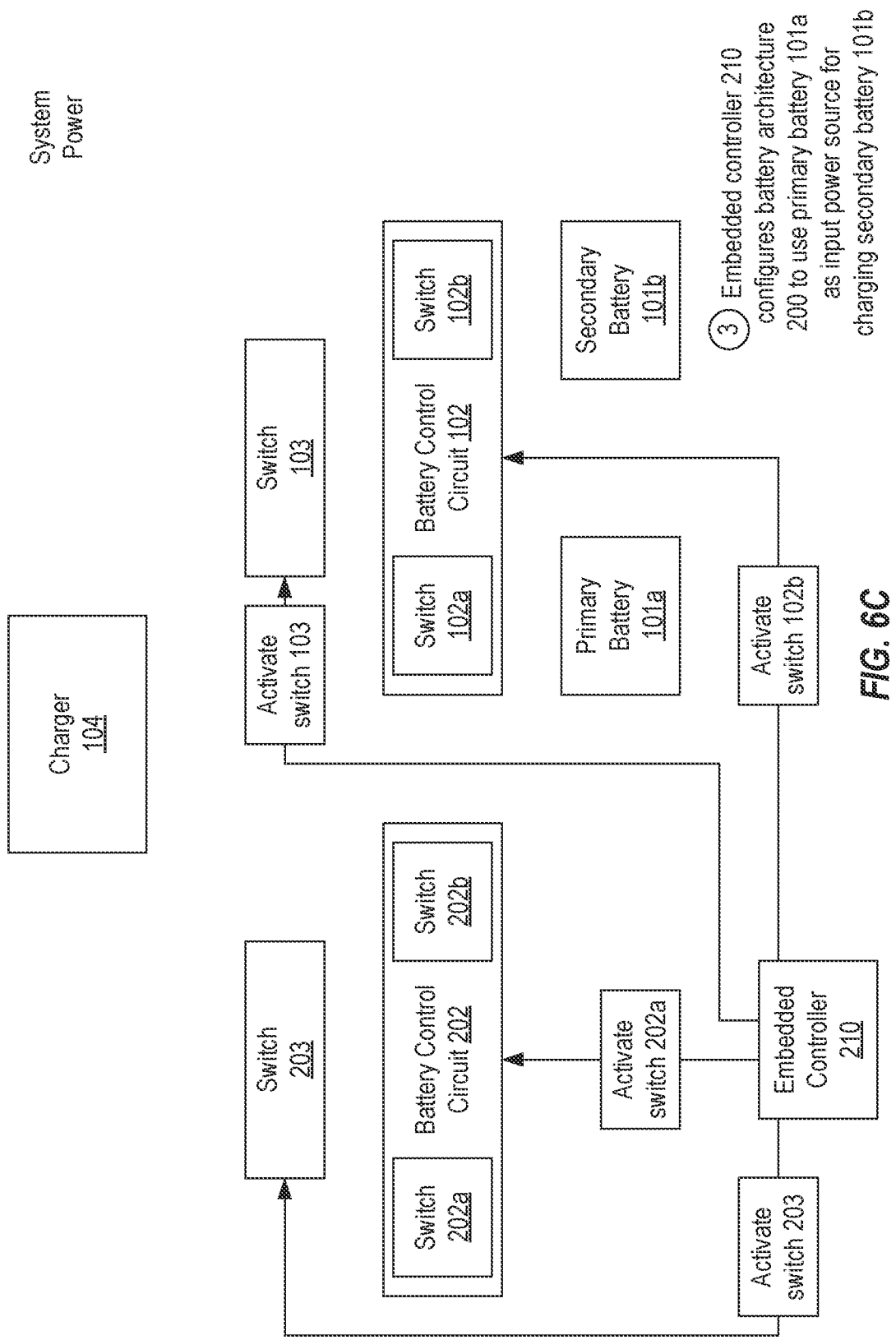

Turning to FIG. 6C, in step 3 and in response to determining that primary battery 101a has a higher RSOC than secondary battery 101b, embedded controller 210 can configure battery architecture 200 to implement the first mode of operation in which primary battery 101a is used as an input power source for charging secondary battery 101b. For example, embedded controller 210 could generate control signals to activate switch 202a and switch 203 to thereby connect primary battery 101a to an input of charger 104 and could generate control signals to activate switch 103 and switch 102b to thereby connect secondary battery 101b to an output of charger 104. Although not shown, embedded controller 210 could also ensure (e.g., via appropriate control signals) that switch 202b does not connect secondary battery 101b to switch 203 and that switch 102a does not connect primary battery 101a to switch 103.

Figure 6D:
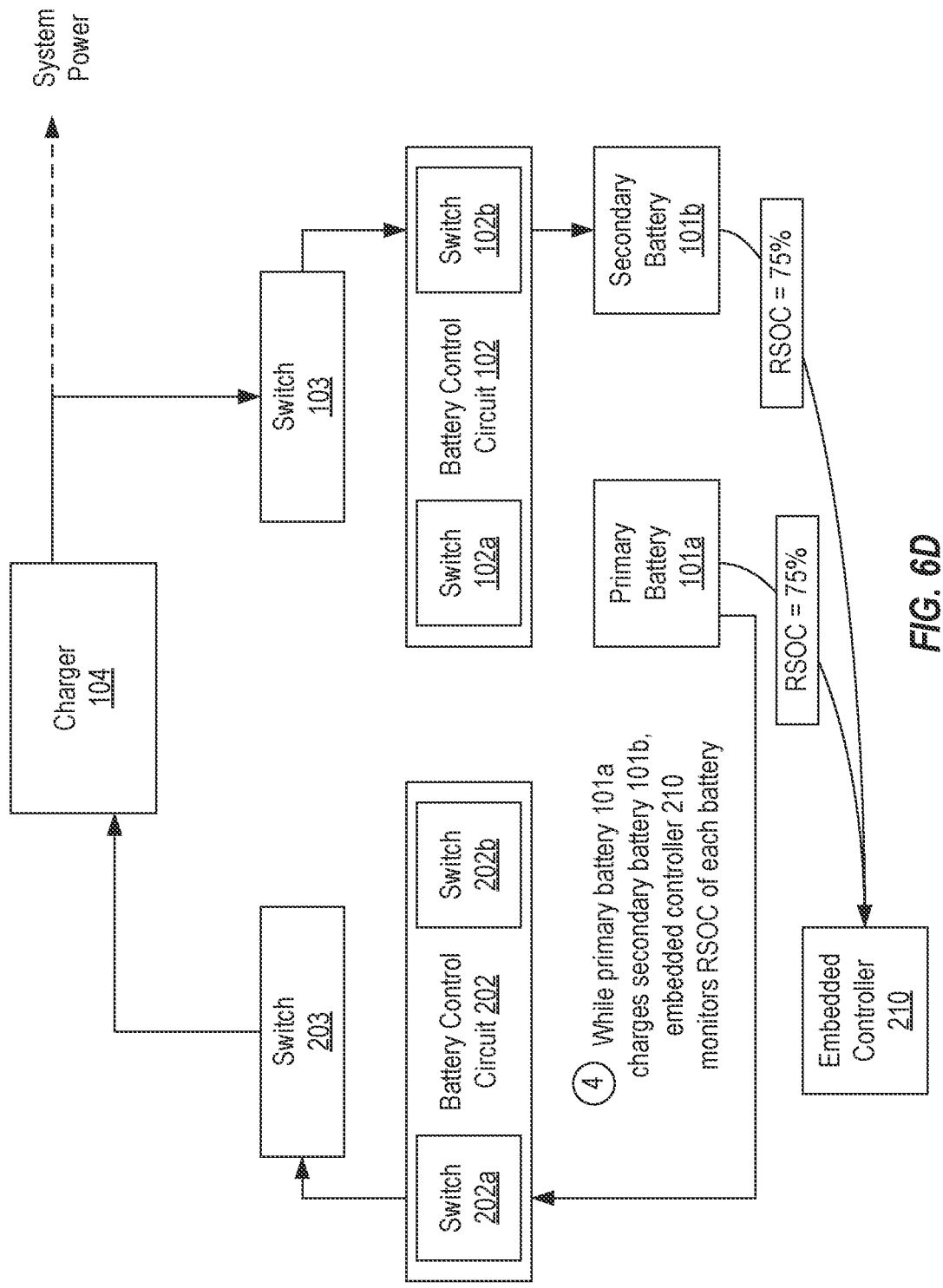

Turning to FIG. 6D, the provision of power resulting from the actions in step 3 is represented with arrows. In particular, primary battery 101a is discharged to provide power for charging secondary battery 101b. In some instances, this discharge of primary battery 101a may also provide power to the system. While this first mode of operation is implemented, in step 4, embedded controller 210 can monitor the RSOC of primary battery 101*a* and secondary battery 101*b*. In this example, it is assumed that the RSOC of both batteries has reached 75%.

Figure 6E:
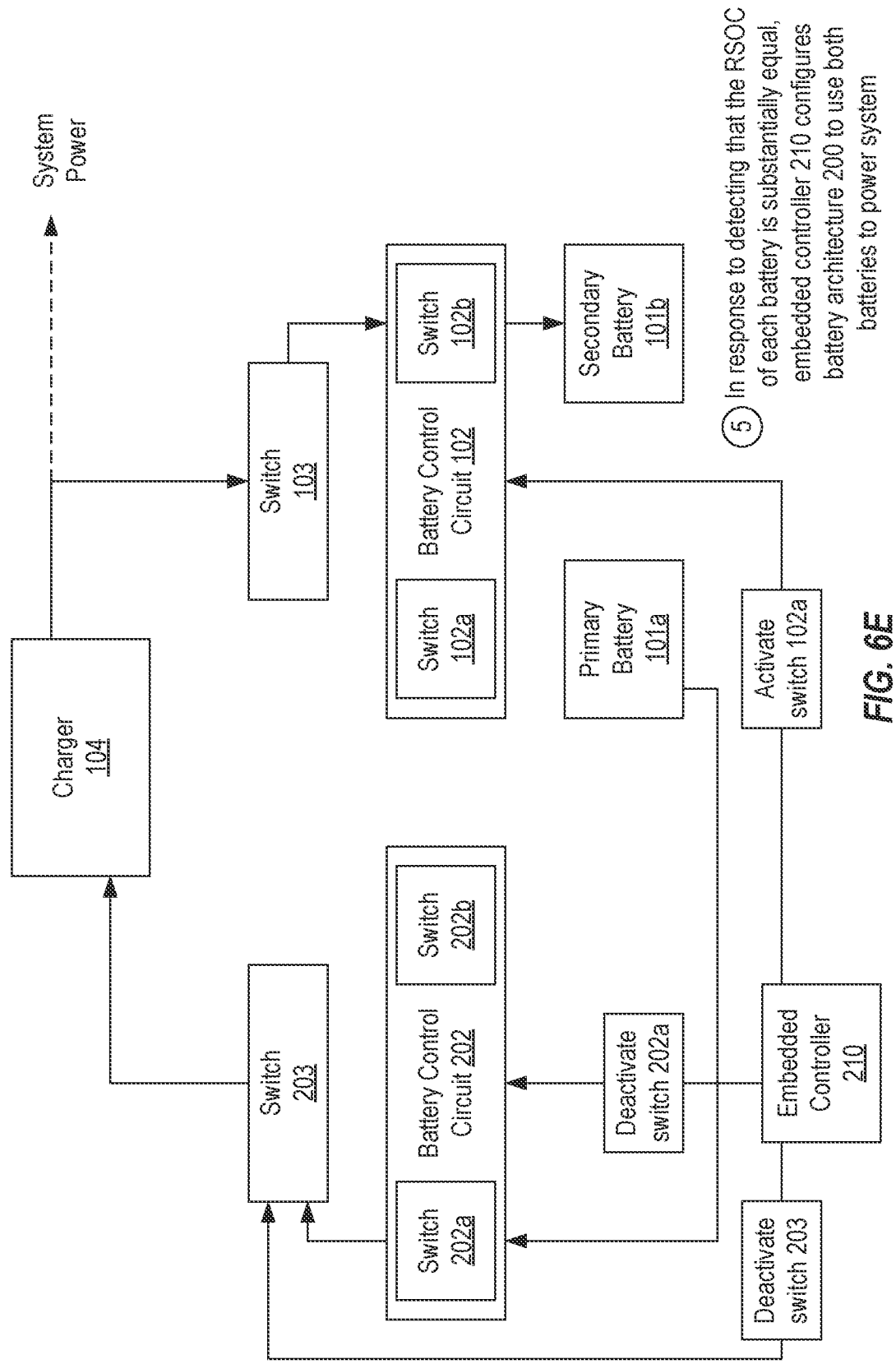

Turning to FIG. 6E, in step 5 and in response to detecting that the RSOC of primary battery 101*a* and of secondary battery 101*b* are substantially equal, embedded controller 210 can reconfigure battery architecture 200 to cause both primary battery 101*a* and secondary battery 101*b* to simultaneously power the system. For example, embedded controller 210 could provide control signals to deactivate switch 202*a* and switch 203 (while retaining switch 202*b* deactivated) and could provide control signals to activate switch 102*a* (while retaining switch 102*b* activated).

Figure 6F:
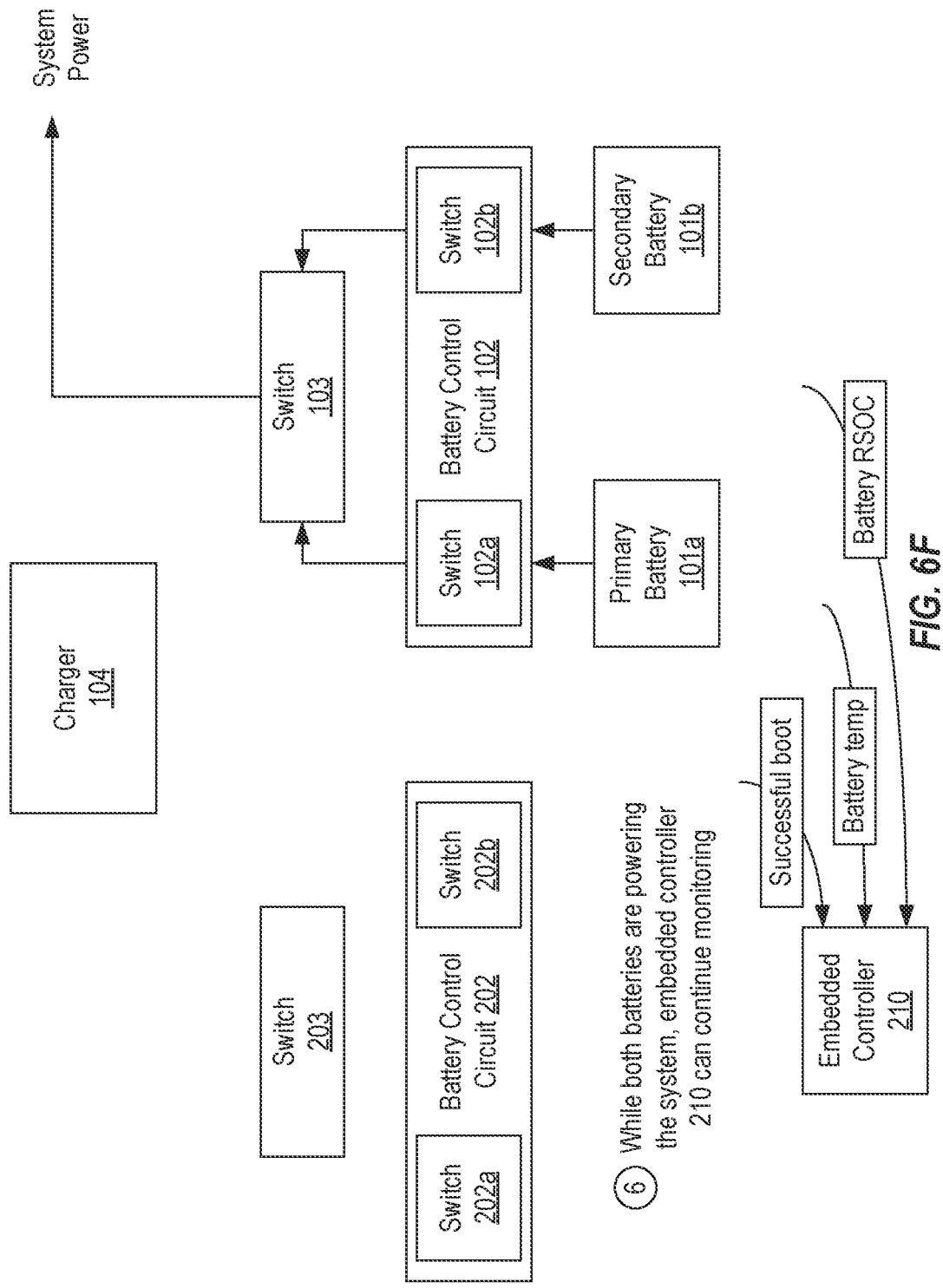

Turning to FIG. 6F, the provision of power resulting from the actions in step 5 is represented with arrows and show that both primary battery 101*a* and secondary battery 101*b* are being discharged to power the system. Even if a reduced discharge rate of one of the batteries due to the low temperature environment is insufficient to boot the system, the combined discharge rates of the batteries may be sufficient thus allowing the system to boot in the low temperature environment. At this point, embedded controller 210 can continue monitoring various conditions such as whether the system successfully booted, the temperature of each battery, the RSOC of each battery, etc. For example, in some embodiments, if embedded controller 210 detects that the battery temperature is no longer below the low temperature threshold (whether during the implementation of the first mode of operation or the second mode of operation), it can revert battery architecture 200 to a typical configuration (e.g., using a single battery to provide power to the system).

As can be seen, embodiments of the present invention enable a laptop or other battery-powered computing device to be booted and used in low temperature environments without requiring specialized batteries, heating elements, etc. By selectively implementing the second mode of operation in low temperature environments, possibly proceeded by the first mode of operation, embedded controller 210 can expand the range of operating conditions that a battery architecture with multiple batteries can support. Also, the hybrid mode of operation could be used in some embodiments to further enhance the ability to boot the system in low temperature environments and/or to enhance the system's performance in any environment. Furthermore, the second mode of operation could be used at any time to support turbo boost for gaining more performance.

Embodiments of the present invention may be implemented using any suitable circuitry. As one example only, battery control circuits 102 and 202 could be implemented using field effect transistors that embedded controller 210 may drive via appropriate control signals to implement the first and second modes of operation.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A battery architecture comprising:
 a first battery control circuit by which a first battery and a second battery are selectively coupled to an output of a charger and system power;
 a second battery control circuit by which the first battery and the second battery are selectively coupled to an input of the charger; and
 an embedded controller that is coupled to the first battery control circuit and the second battery control circuit.

2. The battery architecture of claim 1, wherein the embedded controller is configured to cause the first battery control circuit to simultaneously connect the first battery and the second battery to the system power.

3. The battery architecture of claim 2, wherein the embedded controller causes the first battery control circuit to simultaneously connect the first battery and the second battery to the system power when a battery temperature is below a threshold or to support enhanced performance of the system.

4. The battery architecture of claim 3, wherein the embedded controller is configured to cause the second battery control circuit to connect one of the first battery or the second battery to the input of the charger and to cause the first battery control circuit to connect the other of the first battery or the second battery to the output of the charger.

5. The battery architecture of claim 4, wherein the embedded controller causes the second battery control circuit to connect one of the first battery or the second battery to the input of the charger and to cause the first battery control circuit to connect the other of the first battery or the second battery to the output of the charger when a charge of the first battery does not match a charge of the second battery.

6. The battery architecture of claim 2, wherein the embedded controller causes the first battery control circuit to simultaneously connect the first battery and the second battery to the system power when the charge of the first battery matches the charge of the second battery.

7. A method for enabling system boot-up in low temperature environments, the method comprising:
 detecting, in a battery architecture, that a charge of a first battery is higher than a charge of a second battery;
 configuring the battery architecture to connect the first battery to an input of a charger and to connect the second battery to an output of the charger to thereby cause the first battery to charge the second battery;
 subsequently detecting, in the battery architecture, that a battery temperature is below a threshold; and
 in response to detecting that the battery temperature is below the threshold, configuring the battery architecture to simultaneously use the first battery and the second battery to provide power for booting a system.

8. The method of claim 7, wherein configuring the battery architecture to simultaneously use the first battery and the second battery to provide power for booting the system comprises generating control signals to cause a first battery control circuit to connect the first battery and the second battery to system power.

9. The method of claim 7, wherein detecting that the charge of the first battery is higher than the charge of the second battery comprises determining that the first battery has a higher relative state of charge.

10. The method of claim 7, wherein configuring the battery architecture to connect the first battery to the input of the charger and to connect the second battery to the output of the charger comprises generating control signals to cause a second battery control circuit to connect the first battery to the input of the charger and to cause a first battery control circuit to connect the second battery to the output of the charger.

11. The method of claim 7, further comprising:
 detecting that the charge of the first battery matches the charge of the second battery;
 wherein the battery architecture is configured to simultaneously use the first battery and the second battery to provide power for booting the system after detecting that the charge of the first battery matches the charge of the second battery.

12. The method of claim 11, wherein the charge of the first battery matches the charge of the second battery when the respective charges are within a defined threshold from one another.

13. The method of claim 7, wherein detecting that the battery temperature is below the threshold comprises reading a battery fuel gauge.

14. A computing device comprising:
a battery architecture comprising:
a first battery control circuit by which a first battery and a second battery are selectively coupled to an output of a charger and system power;
a second battery control circuit by which the first battery and the second battery are selectively coupled to an input of the charger; and
an embedded controller that configures the first battery control circuit and the second battery control circuit to implement a first mode of operation and a second mode of operation;
wherein, in the first mode of operation, one of the first battery or the second battery charges the other of the first battery or the second battery; and
wherein, in the second mode of operation, the first battery and the second battery simultaneously provide power to the system.

15. The computing device of claim 14, wherein the computing device is a laptop.

16. The computing device of claim 14, wherein, in the first mode of operation, one of the first battery or the second battery is connected via the second battery control circuit to an input of a charger and the other of the first battery or the second battery is connected via the first battery control circuit to an output of the charger.

17. The computing device of claim 14, wherein, in the second mode of operation, the first battery and the second battery are simultaneously connected via the first battery control circuit to the system power.

18. The computing device of claim 14, wherein the first mode of operation is implemented when a charge of the first battery does not match a charge of the second battery.

19. The computing device of claim 14, wherein the second mode of operation is implemented when the computing device is in a low temperature environment or to support enhanced performance of the system.

\* \* \* \* \*